United States Patent
Li

(10) Patent No.: US 12,362,327 B2
(45) Date of Patent: Jul. 15, 2025

(54) METHOD OF FORMING PACKAGES OF STACKED CHIPS

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 18/413,020

(22) Filed: Jan. 15, 2024

(65) Prior Publication Data

US 2024/0153918 A1 May 9, 2024

Related U.S. Application Data

(63) Continuation of application No. 17/535,984, filed on Nov. 26, 2021, now Pat. No. 11,973,061.

(30) Foreign Application Priority Data

| Nov. 27, 2020 | (CN) | ............... | 202011352636.4 |
| Nov. 27, 2020 | (CN) | ............... | 202011352638.3 |
| Nov. 27, 2020 | (CN) | ............... | 202011359780.0 |

(51) Int. Cl.
*H01L 21/56* (2006.01)
*H01L 23/00* (2006.01)
(Continued)

(52) U.S. Cl.
CPC ........ *H01L 25/0657* (2013.01); *H01L 21/568* (2013.01); *H01L 23/3128* (2013.01);
(Continued)

(58) Field of Classification Search
None
See application file for complete search history.

(56) References Cited

U.S. PATENT DOCUMENTS

| 2010/0133704 A1* | 6/2010 | Marimuthu | ......... H01L 23/3128 |
| | | | 257/E23.116 |
| 2011/0024916 A1 | 2/2011 | Marimuthu et al. | |

(Continued)

FOREIGN PATENT DOCUMENTS

| CN | 101425510 A | 5/2009 |
| CN | 104885217 A | 5/2015 |

(Continued)

OTHER PUBLICATIONS

Yibu Semiconductor (Shanghai) Co., Ltd., First Office Action, CN 202011359780.0, Apr. 22, 2021, 11 pgs.
(Continued)

*Primary Examiner* — Jay C Chang
(74) *Attorney, Agent, or Firm* — USCH Law, PC

(57) ABSTRACT

A method of forming a package is provided. The method comprises assembling on a carrier a stack of chip layers including a plurality of first chip layers and a second chip layer; encapsulating the stack of chip layers in a molding compound; removing the carrier to form a package main body; forming a redistribution layer on an exposed side of a first chip layer; and dividing the package main body to form a plurality of packages. Each first chip layer includes first chips and chip couplers. A chip package includes at least one chip stack and at least one chip coupler stack on a singulated redistribution layer. Each chip stack includes at least one chip from each chip layer, and each chip coupler stack includes at least one chip coupler and/or at least one chip coupler segment from each of the first chip layers.

20 Claims, 4 Drawing Sheets

(51) Int. Cl.
  *H01L 23/31* (2006.01)
  *H01L 23/538* (2006.01)
  *H01L 25/00* (2006.01)
  *H01L 25/065* (2023.01)

(52) U.S. Cl.
  CPC .......... *H01L 23/5389* (2013.01); *H01L 24/13* (2013.01); *H01L 25/50* (2013.01); *H01L 2924/15311* (2013.01); *H01L 2924/181* (2013.01)

(56) References Cited

U.S. PATENT DOCUMENTS

| | | |
|---|---|---|
| 2014/0225273 A1 | 8/2014 | Thacker et al. |
| 2015/0108661 A1 | 4/2015 | Vincent |
| 2015/0325509 A1 | 11/2015 | We et al. |
| 2017/0011993 A1 | 1/2017 | Zhao |
| 2017/0047308 A1* | 2/2017 | Ho .................. H01L 23/5386 |
| 2019/0035761 A1 | 1/2019 | Goh et al. |
| 2019/0057940 A1 | 2/2019 | Cheah et al. |
| 2019/0067248 A1 | 2/2019 | Yoo |
| 2019/0088504 A1 | 3/2019 | Ho |
| 2020/0091123 A1 | 3/2020 | Sung |
| 2020/0203325 A1 | 6/2020 | Lee et al. |
| 2021/0125960 A1 | 4/2021 | Huang |

FOREIGN PATENT DOCUMENTS

| | | |
|---|---|---|
| CN | 104704631 A | 6/2015 |
| CN | 105118823 A | 12/2015 |
| CN | 106206458 A | 12/2016 |
| CN | 106463493 A | 2/2017 |
| CN | 107644871 A | 1/2018 |
| CN | 107818922 A | 3/2018 |
| CN | 110114874 A | 8/2019 |
| TW | 202032748 A | 9/2020 |
| TW | 202038354 A | 10/2020 |
| WO | WO 2017160284 A1 | 9/2017 |

OTHER PUBLICATIONS

Yibu Semiconductor (Shanghai) Co., Ltd., English Translation of First Office Action, CN 202011359780.0, Apr. 22, 2021, 13 pgs.
Yibu Semiconductor (Shanghai) Co., Ltd., Second Office Action, CN 202011359780.0, Jun. 24, 2021, 8 pgs.
Yibu Semiconductor (Shanghai) Co., Ltd., English Translation of Second Office Action, CN 202011359780.0, Jun. 24, 2021, 14 pgs.
Yibu Semiconductor (Shanghai) Co., Ltd., CN Decision to Grant, CN 202011359780.0, Aug. 19, 2021, 4 pgs.
Yibu Semiconductor (Shanghai) Co., Ltd., English Translation of CN Decision to Grant, CN 202011359780.0, Aug. 19, 2021, 3 pgs.
Shanghai Yibu Semiconductor Co., Ltd., First Office Action, CN 202011352636.4, Apr. 20, 2021, 12 pgs.
Shanghai Yibu Semiconductor Co., Ltd., Second Office Action, CN 202011352636.4, Jun. 8, 2021, 10 pgs.
Shanghai Yibu Semiconductor Co., Ltd., Third Office Action, CN 202011352636.4, Jul. 27, 2023, 9 pgs.
Shanghai Yibu Semiconductor Co., Ltd., First Office Action, TW 110144187, Apr. 21, 2022, 7 pgs.
Shanghai Yibu Semiconductor Co., Ltd., First Office Action, KR 10-2021-0163984, Sep. 5, 2023, 6 pgs.
Shanghai Yibu Semiconductor Co., Ltd., First Office Action, CN 202011627702.4, Jul. 4, 2023, 7 pgs.
Shanghai Yibu Semiconductor Co., Ltd. First Office Action and Search Report, TW 110148083, Oct. 6, 2022, 12 pgs.
Weiping Li, U.S. Appl. No. 17/535,985, Non-Final Office Action issued Sep. 22, 2023.
Weiping Li, U.S. Appl. No. 17/535,987, Non-Final Office Action issued Nov. 8, 2023.
Weiping Li, U.S. Appl. No. 17/566,661, Non-Final Office Action issued Nov. 22, 2023.

* cited by examiner

METHOD OF FORMING PACKAGES OF STACKED CHIPS

CROSS REFERENCE TO RELATED APPLICATIONS

The present application is a continuation of U.S. patent application Ser. No. 17/535,984, filed Nov. 26, 2021, which claims the benefit of priority under the Paris Convention to Chinese Patent Application No. CN202011359780.0, filed Nov. 27, 2020, entitled "Package and Method of Forming the Same," Chinese Patent Application No. CN202011352636.4, filed Nov. 27, 2020, entitled "Package and Method of Forming a Package," and Chinese Patent Application No. CN 202011352638.3, filed Nov. 27, 2020, entitled "Package and Method of Forming the Same," each of which is incorporated by reference herein in its entirety. This application is related to co-pending U.S. patent application Ser. No. 17/535,985, filed Nov. 26, 2021, U.S. patent application Ser. No. 17/535,987, filed Nov. 26, 2021, each which is incorporated by reference herein in its entirety.

FIELD

The present application relates to the technical field of semiconductors, in particular to a method of forming packages of stacked chips.

BACKGROUND

As the functions of semiconductor integrated circuits are ever increasing, and the computation speed gets faster and faster, more and more investment is made in the development of chip stacking technology to find more effective solutions. Wafer Level Packaging (WLP) is the technology of packaging an integrated circuit while it is still part of a wafer, in contrast to the more conventional method of slicing the wafer into individual circuits (dice) and then packaging them. WLP allows integration of wafer fab, packaging, test, and burn-in at wafer level in order to streamline the manufacturing process undergone by a device from silicon start to customer shipment. Current WLP technology, however, does not allow chip-stacking. Thus, in conventional chip stacking technology, stacking is mostly carried out in final assembly, and vertical connection between stacked chips needs to be realized using technologies such as Through Silicon Via (TSV), Through Glass Via (TGV), Through Mold Via (TMV), or Wire-bond (Wire-bond). As a result, the packaging process of conventional chip-stacking techniques is complicated and costly.

SUMMARY

Some embodiments provide a chip package and a process for forming a chip package including a plurality of stacked chips.

According to some embodiments, a method of forming a package includes forming a stack of chip layers over a carrier substrate. Each respective chip layer in the stack of chip layers includes a respective plurality of chips. At least some of the respective plurality of chips have their front sides facing the redistribution layer. The stack of chip layers includes first chip layers and a second chip layer. The first chip layers include a bottom chip layer and at least one middle chip layer between the bottom chip layer and the second chip layer. The first chip layers further include chip couplers. Each chip coupler in a particular chip layer is disposed next to at least one chip in the particular chip layer and includes first coupler contacts on the front side of the particular chip layer, second coupler contacts on an opposing back surface of the particular chip layer, and one or more through vias between respective first coupler contacts and respective second coupler contacts.

In some embodiments, the method of forming the package further includes encapsulating the stack of chip layers in a molding compound to form a molded package body, removing the carrier substrate to expose the front side of the bottom chip layer, forming a redistribution layer (or rewiring layer) on the front side of the bottom chip layer, and dividing the molded package body to form a plurality of chip packages. In some embodiments, a chip package of the plurality of chip packages includes at least one chip from each layer of the stack of chip layers, a singulated portion of the redistribution layer (or singulated redistribution layer), and one or more chip couplers and/or one or more chip coupler segments.

In some embodiments, dividing the molded package body to form a plurality of chip packages includes segmenting at least some of the chip couplers into chip coupler segments.

In some embodiments, chip couplers in neighboring chip layers are offset from each other in a horizontal direction (e.g., a direction parallel to a surface of the carrier substrate) to allow coupling of chip contacts of chips in different chip layers to the redistribution layer via the chip couplers. For example, a first chip coupler in a first chip layer is disposed next to a first chip in the first chip layer, a second chip coupler in a second chip layer immediately above or below the first chip layer is offset from the first chip coupler in the horizontal direction such that a first portion of the second chip coupler is directly above or below the first chip coupler and a second portion of the second chip coupler is directly above or below the first chip.

In some embodiments, the chip couplers include active or passive coupling devices.

In some embodiments, the through vias are formed in a material such as glass or silicon.

In some embodiments, two adjacent chip couplers in two adjacent chip layers are offset from each other in the horizontal direction such that central axes of the two adjacent chip coupler in a vertical direction are offset from each other. In some embodiments, two adjacent chip couplers in two adjacent chip layers have about the same size but are offset from each other in the horizontal direction such that one edge of one chip coupler protrudes beyond a corresponding edge of the other chip coupler. In some embodiments, two adjacent chip couplers in two adjacent chip layers are sized differently such that two opposing edges of one chip coupler protrudes beyond two corresponding edges of the other chip coupler.

in some embodiments, two chip couplers in two non-adjacent chip layers (e.g., the two chip layers sandwiching another chip layer) are aligned with each other such that, a central axis of one or the two chip couplers in the vertical direction may coincide with a central axis of that the other one of the two chip couplers.

In some embodiments, at least a first subset of the chip couplers are substantially the same (e.g., having about the same size, the same number of through vias, and the same wiring on corresponding surfaces. In some embodiments, at least a second subset of the chip couplers are substantially the same (e.g., having about the same size, the same number of through vias, and the same wiring on corresponding surfaces, but a first chip coupler in the first subset of the chip couplers is different from a second chip coupler in the second subset of the chip couplers (e.g., the first chip coupler is larger or smaller in size and/or have more or less through vias than the second chip coupler.

In some embodiments, the package of the plurality of packages may include a first chip stack including a plurality of stacked first chips, a second chip placed over the first chip stack, and at least one chip coupler stack including a plurality of stacked chip couplers and/or chip coupler segments The second chip is assembled over the at least one chip coupler stack, and electrically coupled to the first chip stack through the at least one chip coupler stack and the singulated redistribution layer (or rewiring layer).

In some embodiments, each chip in the first layers has a rectangular shape, and is flanked by two chip couplers on two opposite edges of the rectangle. In some embodiments, each chip is flanked by four chip couplers on all four edges of the rectangle to allow more chip contacts to be coupled to the redistribution layer by way of the vias in the couplers.

According to some embodiments, a chip package made using the method described herein includes at least one chip stack and at least one chip coupler stack over a redistribution layer. The at least one chip stack includes a plurality of chips and the at least one coupler stack includes a plurality of chip couplers. Each of the plurality of chips has chip contacts on a front side of the chip, and at least some of the plurality of chips have their front sides facing the redistribution layer. Each chip stack includes a plurality of first chips and at least one second chip. The plurality of first chips include at least one bottom chip and one or more middle chips between the at least one bottom chip and the at least one second chip. Each chip coupler stack includes a bottom chip coupler next to a bottom chip, and one or more middle chip couplers next to respective ones of the one or more middle chips. Each of the plurality of chip couplers includes first coupler contacts on a first side, second coupler contacts on an opposing second side, and through vias coupling respective first coupler contacts to respective second coupler contacts. In some embodiments, the at least one chip stack and the at least one chip coupler stack are encapsulated in a molding compound.

The chip package further includes a plurality of bumps disposed on a side of the redistribution layer facing away from the at least one chip stack.

In some embodiments, the chip couplers in the chip package form first and said second chip coupler stacks including a plurality of stacked first chip couplers in the first chip coupler stack and a plurality of stacked second chip couplers in a second chip coupler stack.

In some embodiments, each of the chip couplers includes an active coupling device or a passive coupling device.

In some embodiments, the through vias are formed a material such as glass or silicon.

In some embodiments, adjacent chip couplers in the first or second chip coupler stack have different configurations (e.g., having different sizes and/or different numbers of through vias).

In some embodiments, each of the plurality of chips in the chip package is disposed between two chip couplers having different configurations (e.g., having different sizes and/or different numbers of through vias).

In some embodiments, the chip couplers in the chip package include chip couplers having different sizes (different areas and/or height).

In some embodiments, at least some of the plurality of chip couplers include surface wirings or traces that couples different contacts on a same surface of a same chip coupler.

In some embodiments, at least one of the plurality of chips is coupled to at least another of the plurality of chips by way of vias and surface wirings or traces of two or more chip couplers.

In some embodiments, at least two chips among the at least one bottom chip and the one or more middle chips have different sizes.

Thus, according to some embodiments, wafer-level chip stacking is realized using chip couplers or connectors and a one-stop WLP process without using TSV and the like in chips. Thus, the complexity and manufacturing cost of three-dimensional multi-layer chip package is reduced.

In addition, according to some embodiments, the specification and the size of the chips and the chip couplers can be unified and/or standardized through layout design, thereby reducing the cost for manufacturing the chips and the chip coupler before forming the package.

The foregoing summary provides an overview of the technical solutions according to certain embodiments, which are described below in further detail in order to make the features, and advantages of the embodiments more clearly understandable.

BRIEF DESCRIPTION OF THE DRAWINGS

The above and other objects, features and advantages of exemplary embodiments will become readily apparent from the following detailed description read in conjunction with the accompanying drawings. Several embodiments are illustrated by way of example, and not by way of limitation, in the figures of the accompanying drawings and in which the same or corresponding reference numerals indicate the same or corresponding parts.

DETAILED DESCRIPTION OF THE EMBODIMENTS

Figure 1:
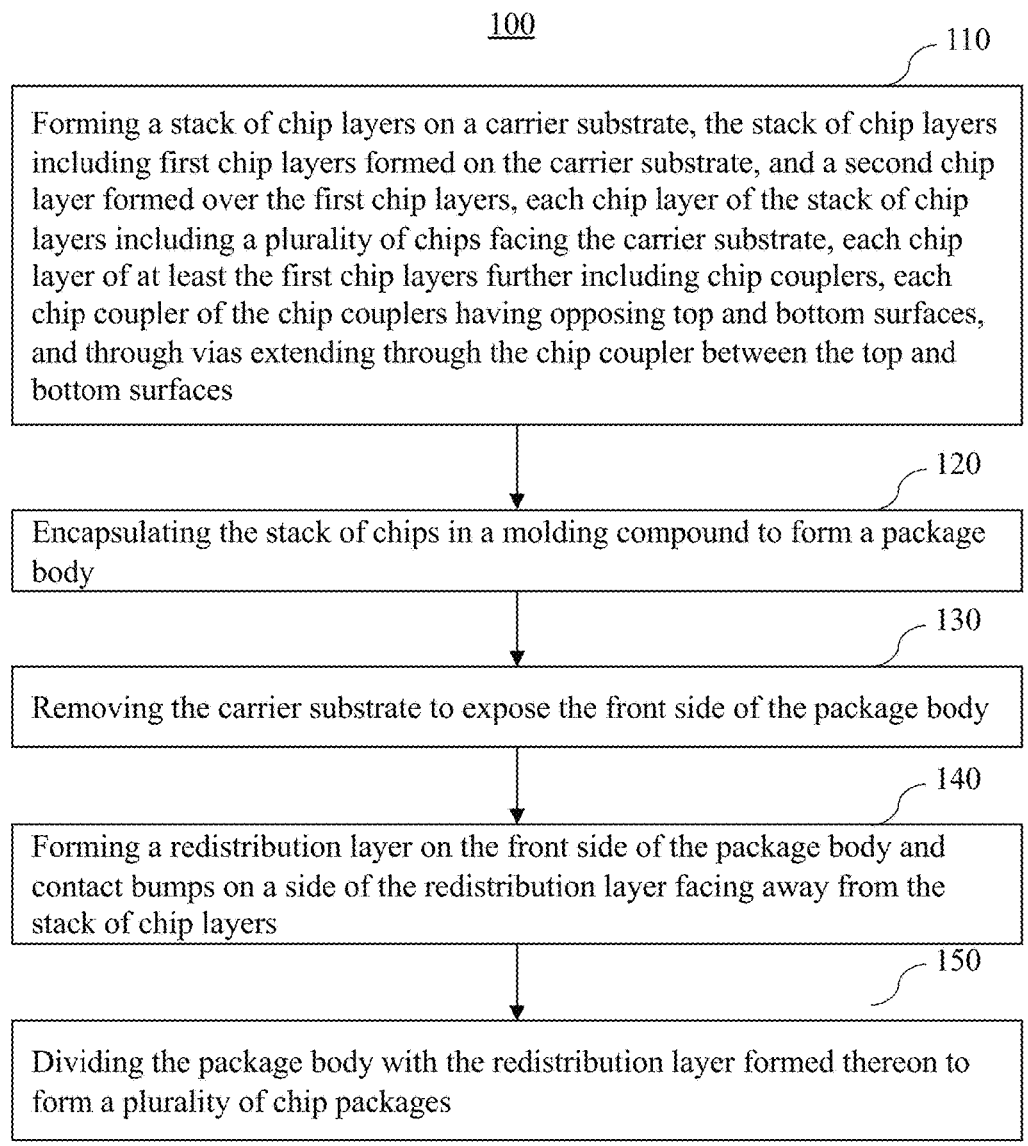
FIG. 1 shows a flow diagram of a method for forming a package according to some embodiments.

The following disclosure provides various embodiments, or examples, for implementing various features or solutions. Specific examples of components and arrangements are described below to simplify the present disclosure. These are, of course, merely examples and are not intended to limit the invention. For example, in the following description, forming a first feature over or on a second feature may include embodiments in which the first and second features are formed in direct contact, and may also include embodiments in which additional features may be formed between the first and second features, such that the first and second features may not be in direct contact. Further, the present invention may repeat reference numerals and/or characters in the various embodiments. This repetition is for the purpose of simplicity and clarity and does not in itself dictate a relationship between the various embodiments and/or configurations discussed.

Also, spatially relative terms, such as "below . . . ," "below . . . ," "lower," "above . . . ," "upper," "above . . . ," and the like, may be used herein for ease of description to describe one element or component's relationship to another element or component (or elements) as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, herein, the term "assembly" refers to the implementation of circuit coupling between the various electronic devices. The term "chip" may refer to various types of chips, such as logic chips, storage chips, and the like.

FIG. 1 shows a flow diagram illustrating a method 100 of forming a package according to an embodiment. The method comprises: Step 110, in which a stack of chip layers is formed on a carrier or carrier substrate; Step 120, in which a molding process is performed to encapsulate the stack of chip layers in a molding compound; Step 130, in which the carrier is removed to form a package main body; Step 140, in which a redistribution or rewiring layer is formed on the package main body and, afterwards, solder bumps are formed on a side of the redistribution layer facing away from the stack of chip layers; and Step 150, in which the package main body together with the redistribution layers formed thereon is divided (or singulated) to form a plurality of packages.

In some embodiments, the carrier or carrier substrate is a high surface flatness component (e.g., a semiconductor wafer), and each respective chip layer in the stack of chip layers includes a respective plurality of chips. Each chip has chip contacts (e.g., input/output or I/O pads or bumps) on a front side of the chip, and at least some chips in the stack of chips are placed facing down (e.g., having their front side facing the carrier substrate). The stack of chip layers includes first chip layers and a second chip layer. The first chip layers include a bottom chip layer and at least one middle chip layer between the bottom chip layer and the second chip layer. The first chip layers further include chip couplers. Each chip coupler in a particular chip layer is disposed between two chips in the particular chip layer or near an edge of the particular chip layer. Each chip coupler includes first coupler contacts on a first surface facing the carrier, second coupler contacts on an opposing second surface facing away from the carrier, and one or more through vias coupling respective first coupler contacts to respective second coupler contacts.

In some embodiments, after the molding process is performed on the chip layer, a molded package structure may be formed on the carrier. In some embodiments, the material used for the molding compound may include solid or liquid molding materials such as epoxy resins, organic polymers, or other compounds with or without silicon-based or glass fillers. In some embodiments, a front side of the bottom layer is exposed after the carrier substrate is removed and the redistribution layer is formed on the front side of the bottom layer.

In some embodiments, removing the carrier, forming the rewiring layer and the bumps, and dividing the molded package body can be carried out using processes known in conventional Wafer Level Packaging (WLP) technologies.

FIGS. 2A-2C and 3 to 4 illustrate schematic cross-sectional views, layout views and perspective views of the stack of chip layers and components thereof at various stages of the method of forming a package according to certain embodiments.

Figure 2A:
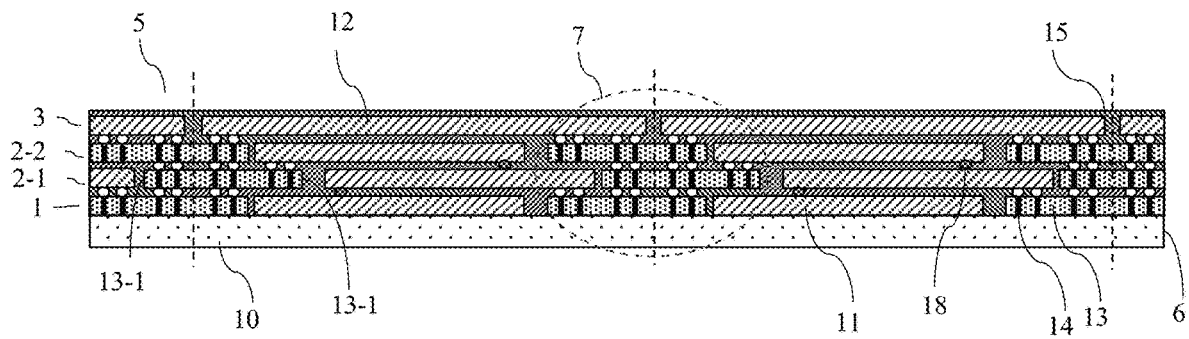
FIGS. 2A-2C and 3 to 4 show schematic cross-sectional views, layout views and perspective views of various stages of a package being formed in a process for forming a package according to some embodiments.

As shown in FIG. 2A, after performing steps 110 and 120, a plurality of (e.g., four) chip layers are placed and assembled on a carrier 10, including a plurality of first chip layers and a second chip layer 3, the plurality of first chip layers including a bottom chip layer 1 and one or more middle chip layers 2 (e.g., chip layers 2-1 and 2-2). Each of the first chip layers may include a plurality of first chips 11 and a plurality of chip couplers 13. The second chip layer 3 may include a plurality of second chips 12, and may or may not include any chip couplers. In some embodiments, although FIG. 2A shows two middle chip layers 2 as an example, there may be more or less middle chip layers 2. The bottom chip layer 1, the one or more middle chip layers 2, and the second chip layer 3 together form a stack of chip layers 5.

Figure 2B:
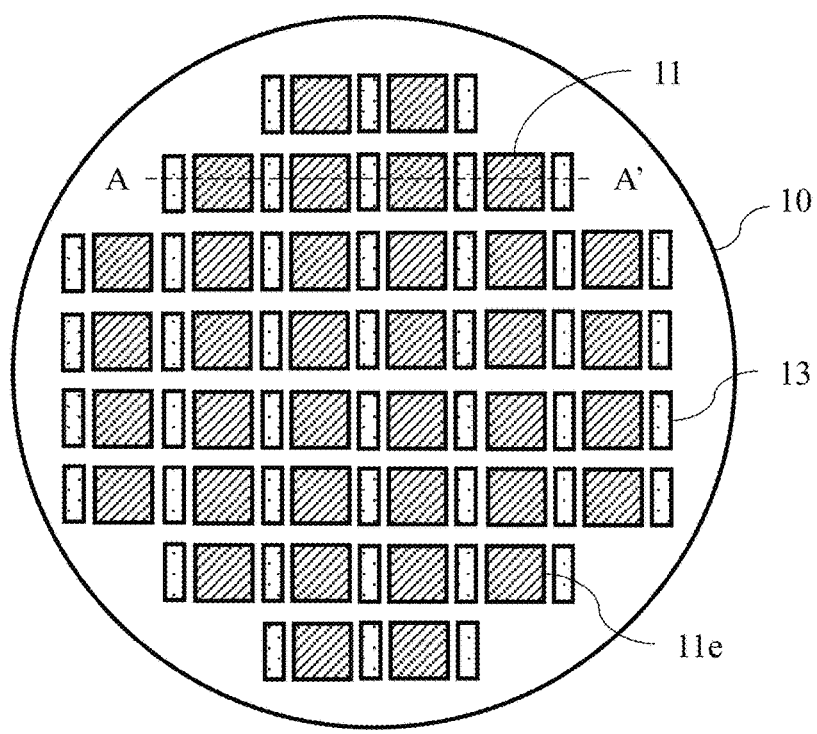

FIG. 2B is a layout view of the bottom chip layer on the carrier 10, with dashed line A-A' indicating where the cross-section of FIG. 2A is taken. As shown in FIG. 2B, a plurality of first chips 11 and a plurality of chip couplers or connectors 13 may first be placed on the carrier 10 to form the bottom chip layer 1. The first chips 11 and the chip couplers 13 in the bottom chip layer 1 are spread horizontally across a flat surface of the carrier 10, with each chip coupler 13 in the bottom chip layer 1 placed next to at least one neighboring first chip 11, and each first chip 11 being flanked by one or more corresponding chip coupler(s) 13. FIG. 2B also shows that the first chips 11 are placed on the carrier facing down with its back surface facing away from the carrier 10, according to some embodiments.

In some embodiments, a chip layer can be formed such that each chip is flanked on all four sides or edges by four chip couplers, respectively, so as to accommodate more I/O contacts on the chips.

Figure 2C:
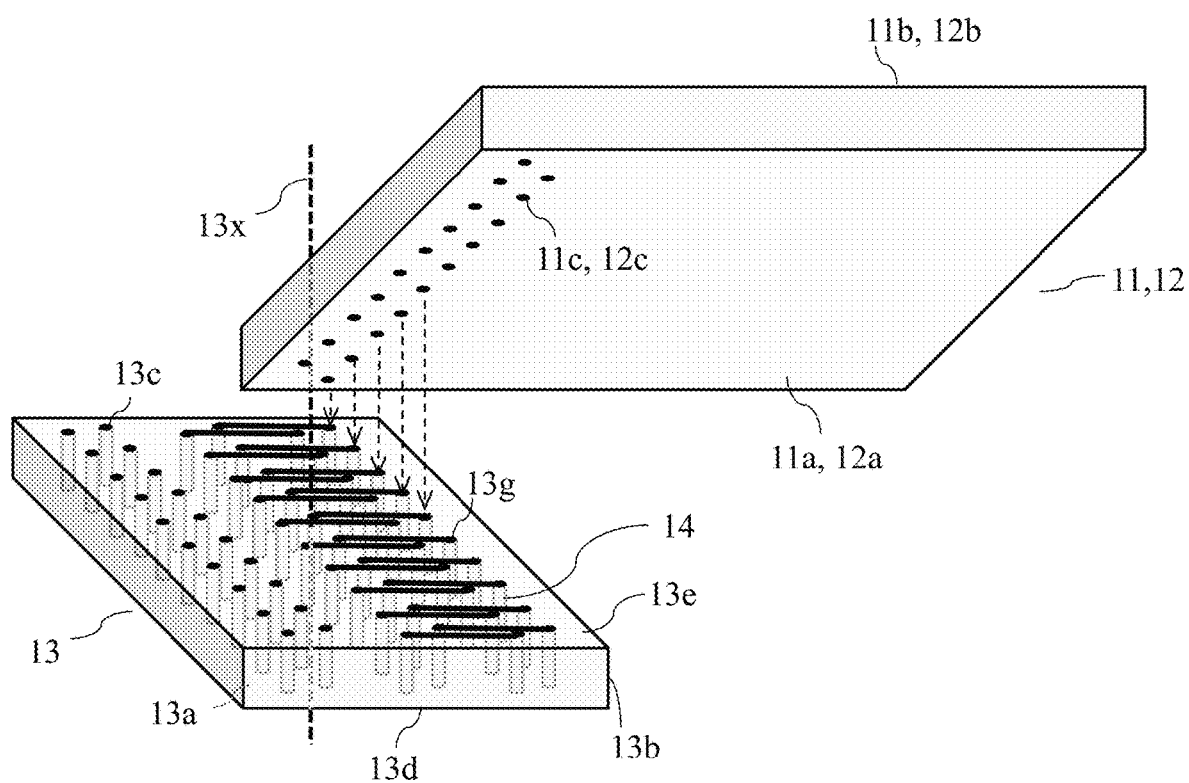

FIG. 2C is a perspective view of a chip coupler 13 and a first chip 11 of a middle chip layer 2 or a second chip 12 of the upper chip layer 3, as the chip 11 or 12 is assembled on the chip coupler 13. As shown in FIG. 2C, the front surface 11a or 12a of a first chip 11 or second chip 12 has contact pads or bumps 11c or 12c arranged proximate to an edge 11e or 12e of the first chip 11 or second chip 12. As also shown in FIG. 2C, in some embodiments, the chip coupler 13 has four edges (including a left edge 13a, a right edge 13b), a first (bottom) side or surface 13d and a second (top) side or surface 13e. The chip coupler 13 further includes first contact pads or bumps 13c on the bottom surface 13d, second contact pads or bumps 13c on the top surface 13e, and through vias 14 coupling respective first contact pads to respective bottom contact pads. In some embodiments, the chip coupler 13 may further include surface wirings or traces 13g on the top surface and/or the bottom surface to couple some of the contact pads on the top or bottom surface to respective ones of some other contact pads on the same surface. A central axis 13x of the chip coupler 13, which is a virtual line perpendicular to the top or bottom surfaces of the chip coupler 13 and is equal distanced from the four edges of the chip coupler, is also shown in FIG. 2C.

As shown by the dashed arrows in FIG. 2C, forming the stack of chips may include aligning and coupling (electrically and/or mechanically) the contact pads of bumps 11c or 12c on the front side of chip 11 or 12 to corresponding contacts 13c on the top surface 13e of chip coupler 13. In some embodiments, the contact pads of bumps 11c or 12c on the front side of chip 11 or 12 are coupled to corresponding contacts 13c on the top surface 13e of chip coupler 13 using a soldering process. In some embodiments, each of the first chips 11 in the middle layers and the second chips 12 in the top layers is placed and assembled in the stack of chip layers with its contact pads or bumps 11c, 12c mechanically and electrically coupled to a subset of the chip coupler contacts 13c on a top or bottom surface of a chip coupler 13 by, for example, soldering.

As shown in FIG. 2A, one or more middle chip layers 2 may be stacked on the bottom chip layer 1, and finally the second chip layer 3 is placed and assembled on the uppermost middle chip layer 2 (e.g., the middle chip layer 2 farthest from the carrier 10). Each chip layer 1, 2, or 3 includes a front side facing the carrier and a back surface opposite to the front side and facing away from the carrier. In some embodiments, at least some of the first chips 11 and the second chips 12 have their front surfaces a on the front side of the corresponding chip layer and their back surfaces on the back side of the corresponding chip layer. In some embodiments, the front surface of each chip 11, 12 faces the carrier substrate and the back surface of each chip 11, 12 faces away from the carrier substrate. In the art, the surface of a chip having, for example, contacts or contact pads or contact bumps (not shown) is considered the front surface. Thus, in some embodiments, the first chips 11 and the second chips 12 are placed face-down (e.g., having the front surfaces facing the carrier 10).

In some embodiments, the chip couplers or connectors 13 may be used to electrically couple electronic devices (e.g., chips 11 or 12, redistribution layers, and other chip couplers or connectors 13) to other electronic devices. In some embodiments, any electronic device to which the chip connector 13 is coupled is not in the same chip layer as the chip connector 13. In some embodiments, the chip couplers 13 may be made of a material such as glass or silicon. In some embodiments, the chip couplers 13 may include active or passive coupling devices. For example, the chip connector 13 may have several through holes or vias 14 in the vertical direction (e.g., in a direction perpendicular to the surface of the carrier 10 on which the stack of chip layers are placed and assembled, or a direction traversing different chip layers in the stack of chip layers). The via 14 may be filled with one or more conductive materials (e.g., one or more metals). In some embodiments, conductive traces (or surface wirings) may be provided on either or both the upper and lower surfaces of the chip connector 13 (e.g., the opposing surfaces on two ends of the vias 14) to electrically couple different vias 14 in the chip connector 13.

In some embodiments, adhesive pads (or adhesive dots or spacers) may be provided to mechanically couple chips in different chip layers, such as adhesive dots 18 shown in FIG. 2A. The adhesive dots 18 serve to both electrically isolate and mechanically secure chips in the different chip layers. In some embodiments, the adhesive dots 18 are made of a non-conductive material. In some embodiments, the use of adhesive dots is not necessary and is omitted.

After the chip layers are placed and assembled, the chip layers may be encapsulated or molded in a molding compound (e.g., plastic) to form a molded package body structure 15.

In some embodiments, as shown in FIG. 2A, the chip couplers 13 can be identical (e.g., having the same size, the same number of through vias, and/or the same surface wirings) to allow uniform design and manufacturing. In some embodiments, the chip couplers in the stack of chip layers form a plurality of chip coupler stacks 7. Each chip coupler stack 7 includes a set of stacked chip couplers, which may include at least one chip coupler from each of the bottom chip layer 1 and the one or more middle chip layers 2. To allow surface contacts with devices in different layers, the chip couplers in a chip coupler stack 7 are placed in a zig-zag manner. For example, in each chip coupler stack 7, chip couplers in adjacent chip layers are offset from each other (e.g., a first chip coupler in a first chip layer horizontally overlaps in part with a second chip coupler in a second chip layer adjacent the first chip layer and in part with a chip in the second chip layer. In other words, the edges (e.g., left and right edges) 13a, 13b of the first chip coupler do not coincide or align with the corresponding edges of the second chip coupler. Or, the central axis of the first chip coupler is horizontally offset from, and does not coincide or align with, the central axes of the second chip coupler. In some embodiments, in each chip coupler stack 7, the center axis of the first chip coupler in a first chip layer (e.g., bottom chip layer 1) may coincide with the center axis of the chip coupler in a third chip layer (e.g., middle chip layer 2-2) that is separated from the first chip layer by the second chip layer (e.g., middle chip layer 2-1).

Figure 3:
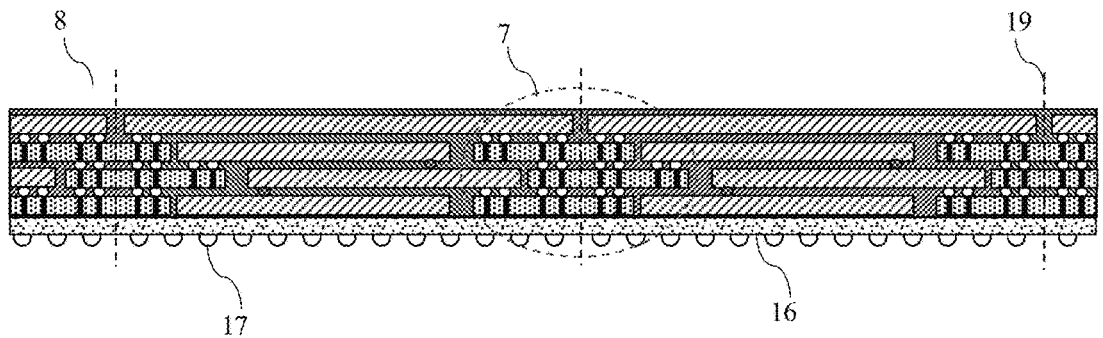

FIG. 3 shows the structure of a package body 8 after steps 130 and 140 are performed.

As shown in FIG. 3, after removing the carrier 10, a redistribution or rewiring layer 16 may be formed under the package body 8 (e.g., on the exposed front side of the first chip layer 1). In some embodiments, bumps 17 may be formed under the rewiring layer 16 (e.g., on a side of the rewiring layer 16 facing away from the stack 5 of chip layers).

In some embodiments, after steps 130 and 140, step 150 is performed to divide the package body 8 into a plurality of singulated chip packages. For example, as shown in FIG. 3, the package body 8 can be divided by cutting along vertical lines 19 through a chip stack 7, segmenting at least some of the chip couplers in the chip coupler stack 7 into chip coupler segments.

Figure 4:
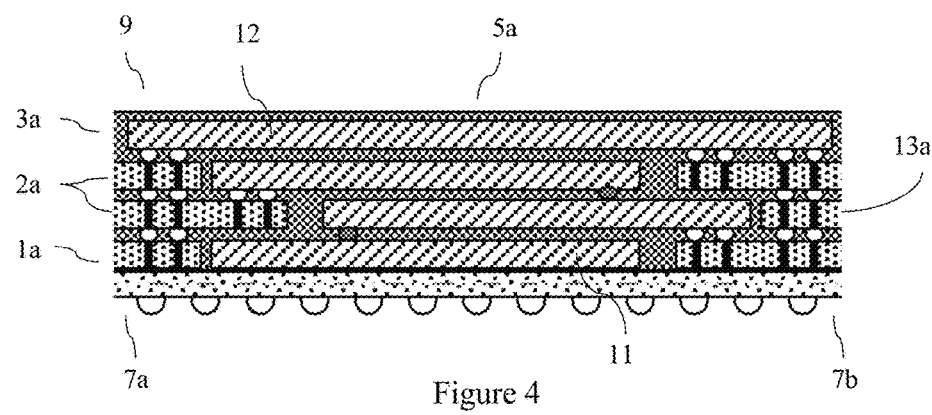

FIG. 4 shows a cross-sectional view of a chip package 9 after step 150. As shown in FIG. 4, the chip package 9 includes a stack of chip layers. Each respective chip layer in the stack of chip layers has a front side and an opposing back side, and includes at least one chip having chip contacts on the front side of the respective chip layer. The plurality chip layers include a bottom chip layer 1a, which is a singulated section of the bottom chip layer 1 in the package body 8, a second chip layer 3a, which is a singulated section of the second chip layer 3, and at least one middle chip layer 2a between the bottom chip layer 1a and the second chip layer 3a in the package body 8. Each middle chip layer 2a in the chip package 9 is a singulated section of a corresponding middle chip layer 2 in the package body 8. The bottom chip layer 1a and the at least one middle chip layer 2a further include chip couplers 13a. Each chip coupler 13a in a particular chip layer is disposed next to a chip in the particular chip layer and includes first coupler contacts on the front side of the particular chip layer, second coupler contacts on the back surface of the particular chip layer, and through vias between respective first coupler contacts and respective second coupler contacts. In some embodiments, each of at least some of the chip couplers 13a is a singulated segment of a corresponding chip coupler 13 in the package body 8.

In some embodiments, as shown in FIG. 4, the package 9 comprises two chip connector stacks 7a, 7b each formed by a stack of chip coupler segments 13a, and a chip stack 5a formed by a set of first chips 11 and one second chip 12. In some embodiments, adjacent chip coupler segments in each chip coupler stack are different (e.g., different in sizes, numbers of through vias and/or surface wirings) because they are singulated or cut from identical chip couplers that were horizontally offset from each other in the package body 8.

The second chip 12 may be electrically coupled to the first chips 11 in the chip stack 5a through two chip connector stacks 7a, 7b and a singulated section 16a of the rewiring layer 16. In some embodiments, the second chip 12 may be electrically coupled to any one of the first chips 11 in the chip stack 5a through any one or both of the chip connector stacks 7a, 7b and the re-wiring layer, or the second chip 12 may be electrically coupled to any one of the first chips 11 in the chip stack 5a through two or more chip connectors 13a in the chip connector stacks 7a, 7b.

In some embodiments, there are at least two first chips 11 in the chip stack 5a and at least two chip couplers in each chip coupler stack 7a, 7b.

In some embodiments, the chip couplers in the chip package 9 may form any of a plurality of forms of chip coupler stacks, such as a trapezoidal-like stack or an inverted trapezoidal-like stacks, where chip couplers in each chip coupler stack can be different in area in the horizontal direction.

Figure 5:
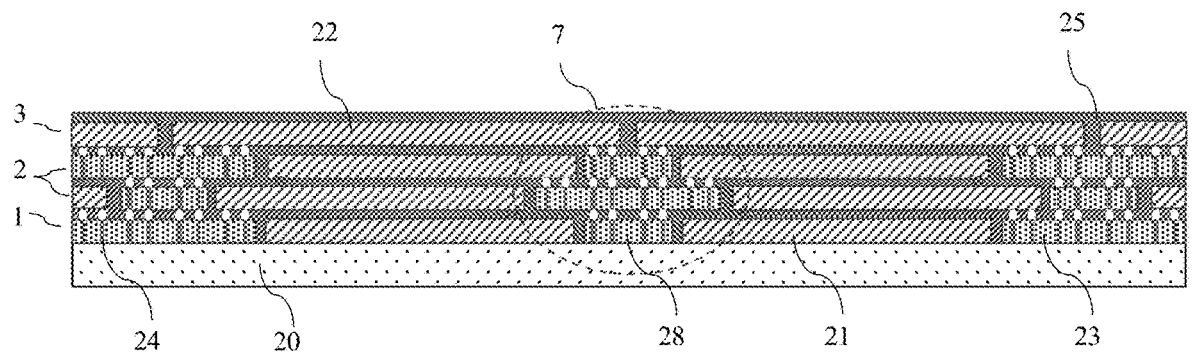
FIGS. 5 to 7 show schematic cross-sectional views of various stages of a package being formed a process for forming a package according to some embodiments.
Figure 6:
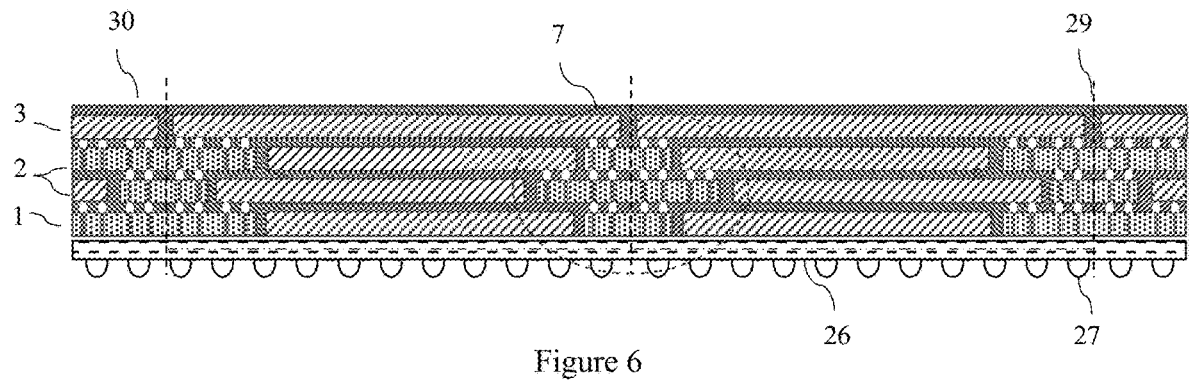
Figure 7:
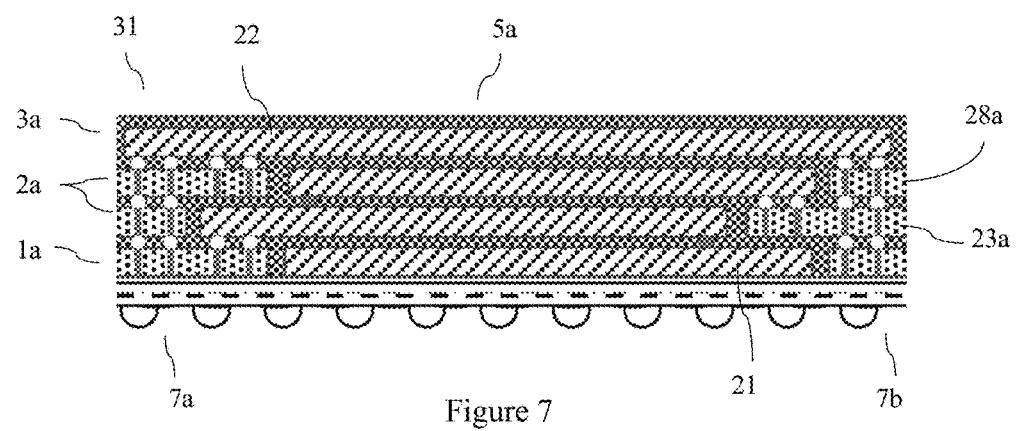

FIGS. 5 to 7 illustrate schematic cross-sectional views of a stack of chip layers at different stages of the method 100 of forming a package according to certain embodiments.

As shown in FIG. 5, a plurality of (e.g., five) chip layers are placed and assembled on a carrier 20, including a bottom chip layer 1, one or more middle chip layers 2, and a second chip layer 3. Each of the bottom chip layer 1 and middle chip layer(s) 2 include a plurality of first chips 21, a plurality of first chip couplers 23, and a plurality of second chip couplers 28. The second chip layer 3 may include a plurality of second chips 22. In some embodiments, there may be more or less middle chip layers 2 than the ones shown in FIG. 5.

A plurality of first chips 21, a plurality of first chip connectors 23 and a plurality of second chip connectors 28 may be placed on a surface of the carrier 20 at corresponding position in the horizontal direction to form e the bottom chip layer 1 and the one or more middle chip layers 2 are similarly formed afterwards. In some embodiments, each first chip 21 is flanked on the left and right sides by two different chip connectors, respectively. For example, first chip 21-1 is flanked on the left side by one of the chip connectors 28 and on the right side by one of the chip connectors 23. In some embodiments, chip couplers 23 and 28 are different in sizes, numbers of through vias, and/or surface wirings.

The chip couplers 23, 28 form chip coupler stacks 7 in the stack of chip layers. In some embodiments, the positions of each type of chip couplers in different chip layers are different. For example, the positions of the chip couplers in the adjacent chip layers are diametrically opposite, so that in the chip coupler stack 7, adjacent chip couplers are different. For example, a second chip coupler 28 would be disposed at a bottom or top of the chip coupler stack 7 or between two first chip couplers 23, and vice versa, as shown in FIG. 5.

As discussed above, a chip has a front surface and a back surface. In the art, the side having, for example, contact pads or bumps is considered the front surface. In some embodiments, first chips 21 and second chips 22 are placed face down (e.g., having the front surface facing the carrier 20).

After the chip layers are placed and assembled, the chip layers may be encapsulated or molded in a molding compound (e.g., plastic) to form a molded package structure 25.

FIG. 6 shows the structure of a package body 29 after steps 130 and 140 are performed.

As shown in FIG. 6, after removing the carrier 20 to form a package body 30, a redistribution layer 26 may be formed under the package body 30 (e.g., on the exposed front side of the first chip layer 1). In some embodiments, bumps 27 may be formed under the redistribution layer 26 (e.g., on a side of the redistribution layer 26 facing away from the stack of chip layers).

In some embodiments, after steps 130 and 140, step 150 is performed to divide the package body 30 into a plurality of singulated chip packages. For example, as shown in FIG. 6, the package body 30 can be divided by cutting through a central axis 29 of each chip coupler stacks 7, splitting each chip coupler in the chip coupler stack 7 in its middle into two equal-sized chip coupler segments.

FIG. 7 shows a cross-sectional view of a chip package 31 after step 150. The chip package 31 corresponds to the chip package 9, although it the different chip kinds of chip coupler segments came from two different kinds of chip couplers, respectively.

Like the package 9, the package 31 comprises two chip connector stacks each formed by a stack of chip coupler segments, and a chip stack formed by at least two first chips 11 and one second chip 12. In some embodiments, adjacent chip coupler segments in each chip coupler stack are different (e.g., different in sizes, numbers of through vias and/or surface wirings).

Like the package 9, the second chip 12 in the package 31 may be electrically coupled to the first chips 11 in the chip stack through the two chip connector stacks and a singulated section of the rewiring layer 26. In some embodiments, the second chip 12 may be electrically coupled to any one of the first chips 11 in the chip stack through any one or both of the chip connector stacks and the re-wiring layer, or the second chip 12 may be electrically coupled to any one of the first chips 11 in the first chip stack through two or more chip connectors in the chip connector stacks.

According to the certain embodiment of the present invention, the specifications or sizes of the first chips, and at least subsets of the chip connectors can be unified, thereby reducing the cost of manufacturing the chips and the chip connectors before implementing the method of forming the packages.

The foregoing has outlined features of several embodiments so that those skilled in the art may better understand the aspects of the present invention. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a chip package, comprising:
    forming a stack of chip layers on a carrier substrate, the stack of chip layers including first chip layers formed over a surface of the carrier substrate, and a second chip layer formed over the first chip layers, each chip layer of the stack of chip layers including a plurality of chips, each chip having a front side facing the carrier substrate and chip contacts on the front side, each chip layer of at least the first chip layers further including chip couplers, each chip coupler of the chip couplers having opposing top and bottom surfaces, and through vias extending through the chip coupler between the top and bottom surfaces;
    encapsulating the stack of chip layers in a molding compound to form a package body on the carrier substrate, the packaged body including the stack of chip layers encapsulated in the molding compound;

removing the carrier substrate from the package body to expose a front side of the package body;

forming a redistribution layer on the front side of the package body; and dividing the package body with the redistribution layer formed thereon to form a plurality of chip packages, each chip package of the plurality of chip packages including a singulated portion of the package body on a singulated portion of the redistribution layer, the singulated portion of the package body including at least one chip from each chip layer of the stack of chip layers and at least one chip coupler and/or at least one chip coupler segment from each chip layer of at least the first chip layers, each of the at least one chip coupler segment being a segmented portion of a respective chip coupler of the chip couplers.

2. The method of claim 1, wherein the chip couplers include passive and active devices.

3. The method of claim 1, wherein the each chip coupler further includes a segment of glass or silicon, the opposing top and the bottom surfaces being opposing top and bottom surfaces, respectively, of the segment of glass of silicon, and wherein the through vias are through the segment of glass or silicon.

4. The method of claim 1, wherein the stack of chip layers includes a bottom chip layer and a middle chip layer formed immediately over the bottom chip layer, the bottom chip layer includes a first chip coupler, the middle chip layer includes a second chip coupler stacked over the first chip coupler, and wherein the first chip coupler and the second chip coupler are offset in a direction parallel to the surface of the carrier substrate such that a first edge of the first chip coupler protrudes beyond a first edge of the second chip coupler, and that a second edge of the second chip coupler protrudes beyond a second edge of the first chip coupler.

5. The method of claim 4, wherein the stack of chips further includes a third chip layer formed over the middle chip layer, the third chip layer including a third chip coupler stacked over the second chip coupler, and wherein the third chip coupler is aligned with the first chip coupler in a direction parallel to the carrier substrate.

6. The method of claim 1, wherein each chip in a respective chip layer of the first chip layers is flanked by two chip couplers in the respective chip layer.

7. The method of claim 6, wherein the singulated portion of the package body includes a chip stack and two chip coupler stacks flanking the chip stack, the chip stack including at least one first chip from each chip layer of the first chip layers and a second chip from the second chip layer, each of the two chip coupler stacks including one chip coupler and/or chip coupler segment from each chip layer of at least the first chip layers, and wherein the second chip is coupled to the redistribution layer via the two chip coupler stacks.

8. The method of claim 1, wherein the stack of chip layers includes a bottom chip layer and a middle chip layer formed immediately over the bottom chip layer, the bottom chip layer includes a first chip coupler, the middle chip layer includes a second chip coupler stacked over the first chip coupler, and wherein the first chip coupler and the second chip coupler are sized differently such that two opposing edges of a larger one of the first chip coupler and the second chip coupler protrude beyond corresponding edges of the smaller one of the first chip coupler and the second chip coupler.

9. The method of claim 8, wherein the stack of chips further includes a third chip layer formed over the middle chip layer, the third chip layer including a third chip coupler stacked over the second chip coupler, and wherein the third chip coupler has a same size as the first chip coupler is aligned with the first chip coupler in a direction parallel to the carrier substrate.

10. The method of claim 8, wherein the second chip coupler is larger than the first chip coupler.

11. The method of claim 8, wherein the second chip coupler is smaller than the first chip coupler.

12. The method of claim 1, wherein the chip couplers include first chip couplers and second chip couplers, each of the first chip couplers having a first size, each the second chip couplers having a second size, the first size being different from the second size.

13. The method of claim 1, wherein the chip couplers are equal in size.

14. The method of claim 1, wherein forming the stack of chip layers on the carrier substrate comprises:

forming a bottom chip layer on the carrier substrate, the bottom chip layer including a bottom chip and a bottom chip coupler next to the bottom chip; and forming a middle chip layer on the bottom chip layer, the middle chip layer including a middle chip coupler, the middle chip coupler having a first portion directly above the bottom chip coupler and a second portion directly above the bottom chip.

15. The method of claim 1, wherein forming the stack of chip layers on the carrier substrate comprises:

forming a bottom chip layer on the carrier substrate, the bottom chip layer including a bottom chip and a bottom chip coupler next to the bottom chip; and forming a middle chip layer on the bottom chip layer, the middle chip layer including a middle chip and a middle chip coupler, the middle chip coupler being offset from the bottom chip coupler in a direction parallel to the surface of the carrier substrate to allow a first portion of the middle chip to be assembled over a corresponding portion of the bottom chip coupler and a second portion of the middle chip to be assembled over a corresponding portion of the bottom chip.

16. The method of claim 1, wherein forming the stack of chip layers on the carrier substrate comprises:

forming a bottom chip layer on the carrier substrate, the bottom chip layer including a bottom chip and a bottom chip coupler next to the bottom chip; and forming a middle chip layer over the bottom chip layer, the middle chip layer including a middle chip and a middle chip coupler, the middle chip coupler is smaller in size than the bottom chip coupler in a dimension parallel to the surface of the carrier substrate, wherein a first portion of the middle chip to is assembled over a corresponding portion of the bottom chip coupler and a second portion of the middle chip be assembled over a corresponding portion of the bottom chip.

17. A method of forming a chip package, comprising:

assembling a plurality of chips and a plurality of chip couplers on a carrier substrate to form a stack of chip layers on the carrier substrate, including placing a first chip and a first chip coupler on the carrier substrate, stacking a second chip on the first chip and the first chip coupler, and stacking a second chip coupler on at least the first chip coupler;

encapsulating the stack of chip layers in a molding compound to form a package body on the carrier substrate, the package body including the stack of chip layers encapsulated in the molding compound;

removing the carrier substrate from the package body to expose a front side of the package body;

forming a redistribution layer on the front side of the package body; and dividing the package body with the redistribution layer formed thereon to form a plurality of chip packages, a chip package of the plurality of chip packages including a singulated portion of the package body on a singulated portion of the redistribution layer, the singulated portion of the package body including at least the first chip, the second chip, the first chip coupler, and the second chip coupler;

wherein:

each chip coupler of the plurality of chip couplers has opposing top and bottom surfaces, chip coupler contacts formed on each of the top and bottom surfaces, and through vias extending through the chip coupler between the top and bottom surfaces;

placing the first chip and the first chip coupler on the carrier substrate includes placing the first chip on the carrier substrate with a front side of the first chip facing the carrier substrate, the front side having chip contacts formed thereon;

stacking the second chip on the first chip and the first chip coupler includes assembling the second chip on the first chip and the first chip coupler with a front side of the second chip facing the first chip, a first edge portion of the second chip protruding beyond a corresponding edge of the first chip, and chip contacts in the first edge portion coupled to corresponding chip contacts on a first portion of the top surface of the first chip coupler; and stacking the second chip coupler on at least the first chip coupler includes coupling at least a portion of the chip coupler contacts on the bottom surface of the second chip coupler to corresponding chip coupler contacts on a second portion of the top surface of the first chip coupler.

18. The method of claim 17, wherein the chip couplers include active and passive devices.

19. The method of claim 17, wherein the each chip coupler of the plurality of chip couplers further includes a segment of glass or silicon, the opposing top and the bottom surfaces being opposing top and bottom surfaces, respectively, of the segment of glass of silicon, and wherein the through vias are through the segment of glass or silicon.

20. The method of claim 17, wherein assembling the plurality of chips and the plurality of chip couplers on the carrier substrate to form the stack of chip layers on the carrier substrate further includes stacking a third chip over at least the second chip and the second chip coupler, and wherein the singulated portion of the package body further includes the third chip coupled to the singulated portion of the redistribution layer through at least the first chip coupler and the second chip coupler.

* * * * *